(12) United States Patent
Wu et al.

(10) Patent No.: US 8,516,429 B2
(45) Date of Patent: Aug. 20, 2013

(54) CIRCUIT OPTIMIZATION METHOD AND APPARATUS FOR ANALOG CIRCUIT MIGRATION

(75) Inventors: Yuping Wu, Beijing (CN); Lan Chen, Beijing (CN)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 13/640,594

(22) PCT Filed: Nov. 15, 2011

(86) PCT No.: PCT/CN2011/082184
§ 371 (c)(1),
(2), (4) Date: Oct. 11, 2012

(87) PCT Pub. No.: WO2013/071480
PCT Pub. Date: May 23, 2013

(65) Prior Publication Data
US 2013/0125080 A1 May 16, 2013

(51) Int. Cl.
*G06F 17/50* (2006.01)
(52) U.S. Cl.
USPC .......................................... 716/132; 716/113
(58) Field of Classification Search
USPC ................................. 716/113, 132
See application file for complete search history.

(56) References Cited

U.S. PATENT DOCUMENTS

| 7,659,751 B2 | 2/2010 | Morgenshtein |
| 7,761,820 B2 * | 7/2010 | Berger et al. ................. 716/122 |
| 2008/0134109 A1 * | 6/2008 | Hammouda et al. ............. 716/3 |
| 2010/0169848 A1 * | 7/2010 | Nahmanny et al. .............. 716/3 |

FOREIGN PATENT DOCUMENTS

| CN | 1510733 A | 7/2004 |
| CN | 102024067 A | 4/2011 |
| CN | 102508977 A | 6/2012 |
| JP | P2001267324 A | 9/2001 |

OTHER PUBLICATIONS

Search Report (PCT/ISA/210) from corresponding Application No. PCT/CN2011/082184, dated Aug. 30, 2012.
Written Opinion (PCT/ISA/237) from corresponding Application No. PCT/CN2011/082184, dated Aug. 13, 2012.

* cited by examiner

*Primary Examiner* — Thuan Do
*Assistant Examiner* — Mohammed Alam
(74) *Attorney, Agent, or Firm* — Westman, Champlin & Kelly, P.A.

(57) ABSTRACT

A circuit optimization apparatus and a circuit optimization method used in analog circuit migration which migrates a source circuit to a target circuit are disclosed. The circuit optimization method comprises: dividing the source circuit into at least one direct current path; determining an adaptation sequence of the at least one direct current path; and optimizing the at least one direct current path in the target circuit one by one in the adaptation sequence. The circuit optimization apparatus and the circuit optimization method improve an optimization efficiency of the analog circuit migration.

12 Claims, 4 Drawing Sheets

CIRCUIT OPTIMIZATION METHOD AND APPARATUS FOR ANALOG CIRCUIT MIGRATION

CROSS-REFERENCE TO RELATED APPLICATION

This Application is a Section 371 National Stage Application of International Application No. PCT/CN2011/082184, filed 15 Nov. 2011, not yet published, the contents of which are hereby incorporated by reference in their entirety.

TECHNICAL FIELD

The present disclosure relates to design automation of an integrated circuit, and in particular, to an optimization method and an optimization apparatus for analog circuit migration.

BACKGROUND

The design of a digital integrated circuit is highly automated and the design period of the digital integrated circuit is thus greatly reduced. As a comparison, the design of an analog integrated circuit is mostly manual. Consequently, the design period of the analog integrated circuit is typically 2 or 3 times that of the digital integrated circuit. The design period of a hybrid integrated circuit is limited by the design period of the analog integrated circuit. The design period of the analog integrated circuit can be reduced by increasing the design automation of the analog integrated circuit. The design period of the hybrid integrated circuit can also be reduced. The design automation of the analog integrated circuit will lower the design cost and provide more competitive products.

Analog circuit migration is typically used in the design of the analog integrated circuit, which migrates a source circuit to a target circuit. The analog circuit migration typically includes optimization of parameter values of devices of an integrated circuit in a circuit level and physical optimization of positions and wirings of the devices of the integrated circuit in a layout level.

In the analog circuit migration, the first approach of circuit optimization includes the following work of a designer: setting parameter values of devices in accordance with prior knowledge, performing circuit simulation, and checking whether the design meets the design requirement or not. The steps of setting the parameter values, performing the circuit simulation and checking the design are repeated until properties of a target circuit approximates properties of a source circuit. The first approach of circuit optimization has the drawback that the optimization efficiency mainly relies on the designer's experience in designing the integrated circuit. The designer should well know variation of the performances of the circuit due to changes of the parameter values of the devices. Actually, the designer cannot well know the variation of the properties of the circuit due to the changes of the parameter values of the devices, when a scale and an integration level of the integrated circuit are increased. The design efficiency of the above approach will be very low.

In the analog circuit migration, the second approach of circuit optimization includes scanning parameter values of the devices and performing circuit simulation using a circuit simulator, and setting suitable parameter values of the devices in accordance with a result of the circuit simulation. The second approach is typically supplementary to the first approach. The second approach of circuit optimization has the drawback that only a limited number of parameters can be scanned. The designer needs to manually select the parameters to be scanned, determine a sequence of scanning the parameters, and set parameter values in accordance with the result of simulation. It is more and more difficult for the designer to manually select the parameters to be scanned, determine a sequence of scanning the parameters, and set parameter values, when the scale and the integration level of the integrated circuit are increased.

In the analog circuit migration, the third approach of circuit optimization includes randomly setting parameter values of the devices, performing circuit simulation or symbolic analysis to obtain performances of the circuit, controlling an optimization process globally to obtain optimal parameter values by optimization algorithm such as simulated annealing, genetic algorithm, and Particle Swarm Optimization (PSO), etc. The third approach of circuit optimization has the drawback that computational complexity is too large to be used in the circuit optimization of the analog integrated circuit with a large scale and a large complexity.

Actually, all of the first to third approaches of the circuit optimization have the drawback that computational complexity is too large to be used in the circuit optimization of the analog integrated circuit with a large scale and a large complexity.

SUMMARY OF THE DISCLOSURE

An object of the present disclosure is to provide an optimization method and an optimization apparatus for analog circuit migration with increased optimization efficiency.

According to one aspect of the present disclosure, there is provided a circuit optimization method used in analog circuit migration which migrates a source circuit to a target circuit, comprising: dividing the source circuit into at least one direct current path; determining an adaptation sequence of the at least one direct current path; and optimizing the at least one direct current path in the target circuit one by one in the adaptation sequence.

According to another aspect of the present disclosure, there is provided a circuit optimization apparatus used in analog circuit migration which migrates a source circuit to a target circuit, comprising: a circuit simulation unit configured to perform source circuit simulation and target circuit simulation; a circuit simulation result analyzing unit coupled to the circuit simulation unit and configured to calculate node signals of the source circuit and the target circuit in accordance with results of the source circuit simulation and the target circuit simulation; a circuit connection analyzing unit coupled to the circuit simulation result analyzing unit and configured to analyzing circuit connections of the source circuit to determine direct current paths in the source circuit; a circuit adaptation sequence determining unit coupled to the circuit connection analyzing unit and configured to analyze a signal arrival sequence of the direct current paths in the source circuit and obtain an adaptation sequence of the direct current paths in the source circuit in accordance with the signal arrival sequence; a parameter value setting unit coupled to the circuit simulation unit and an optimization control unit, and configured to setting parameter values of the devices in one of the direct current path in the target circuit; a signal comparison unit coupled to the circuit simulation result analyzing unit, and configured to compare node signals of the one of the direct current paths in the target circuit and the corresponding one of the direct current paths in the source circuit; and the optimization control unit coupled to the signal comparison unit and the parameter value setting unit, and configured to provide a control signal to the parameter value setting unit in accordance with a comparison result of the signal comparison unit to optimize the direct current paths in the target circuit one by one in the adaptation sequence.

The circuit optimization method and the circuit optimization apparatus divide the source circuit into at least one direct current path, utilize the at least one direct current path as elements of the circuit optimization, and perform the circuit optimization on the at least one direct current path one by one in the adaptation sequence.

The performances of the target circuit match with those of the source circuit at nodes of the direct current paths one by one in the circuit optimization of the analog circuit migration. It ensures that external terminals of the target circuit in new manufacture process meet the requirements of the performance of the target circuit. Moreover, the circuit optimization method and the circuit optimization apparatus decrease computational complexity and the number of invalid trials in the optimization process. It increases the design efficiency in the circuit optimization of the analog circuit migration.

DETAILED DESCRIPTION

In the present application, the term "external terminal" means input/output terminals of the source/target circuit as a while for connecting with external circuits; the term "node" means joints of different parts of the source/target circuit, such as joints between devices or between module; the term "signal branch" means a signal path through devices between one node and another node in the source/target circuit; the term "direct current path" means a path of direct current traversing devices between a voltage supply terminal and a ground terminal; the terminal "signal arrival sequence" means a sequence that a signal arrives different modules, different direct current paths, or different devices, in a direction of signal propagation. For example, the signal firstly arrives an input terminal and finally arrives an output terminal.

Typically, the source circuit and the target circuit each comprise a plurality of devices connected between a plurality of nodes. In view of relatively independent functions of different parts of the circuit, the source circuit and the target circuit each can be divided into at least one module, such as a power supply module, a receiver module, an amplification module, and a signal processing module, etc. Each module includes some devices. Different modules are connected to each other at nodes between the modules, and different devices are connected to each other at the nodes in the modules or between the modules.

The inventor recognizes that the prior approaches of circuit optimization have the above drawbacks mainly because the properties at the external terminals of the source circuit are seen as optimization criteria in the circuit optimization of the circuit migration while the properties at the nodes of the source circuit are omitted. However, it is the properties at the nodes of the source circuit which ensure the properties at the external terminals of the source circuit. Thus, the computational complexity can be decreased by taking the properties at the nodes of the source circuit as the optimization criteria.

The disclosure will be further illustrated in detail in the following embodiments in conjunction with the accompanying drawings, so that the object, solution and advantages of the present disclosure are more apparent. It should note that the embodiments here are only illustrative and not restrictive for the disclosure as claimed.

Figure 1:
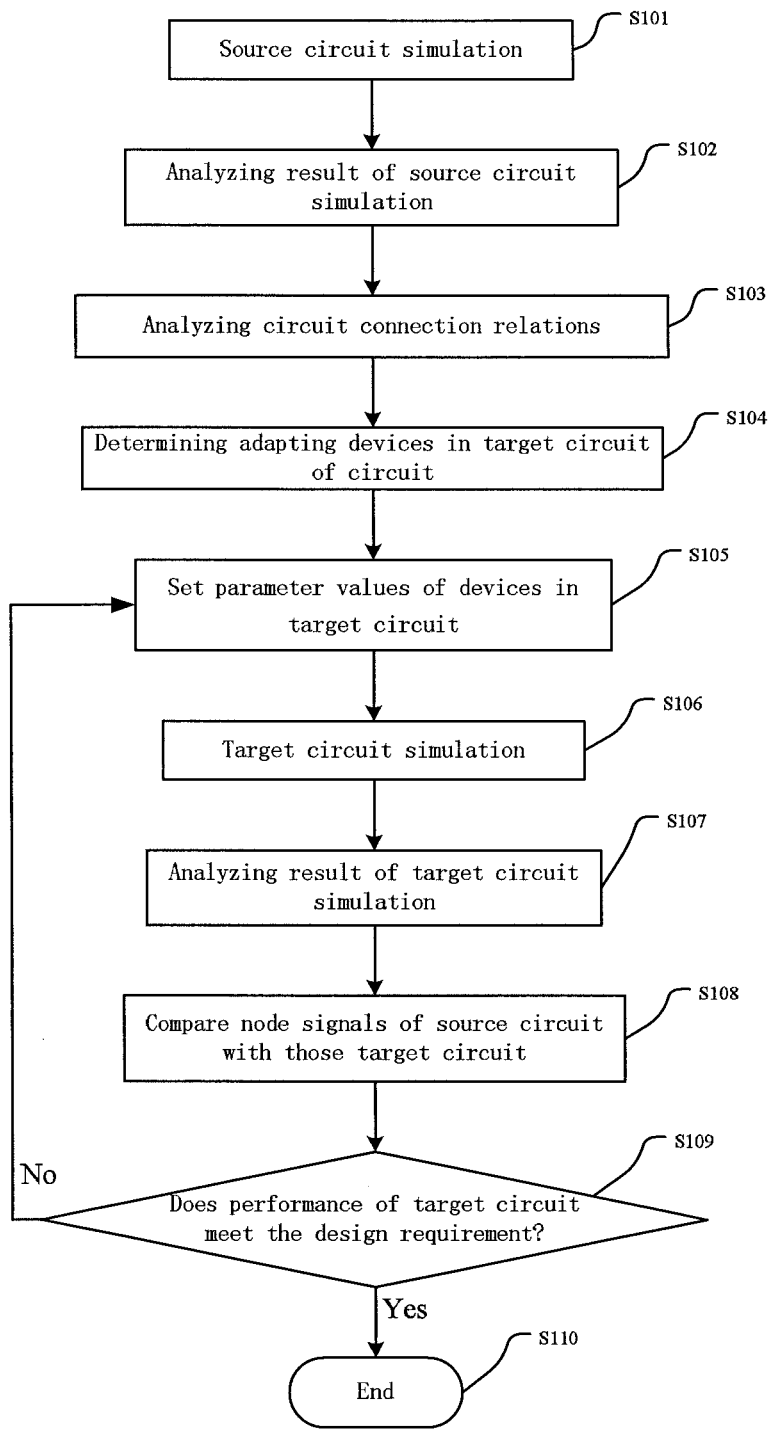
FIG. 1 is a flow chart illustrating a circuit optimization method used in analog circuit migration according to an embodiment of the present disclosure.

FIG. 1 is a flow chart illustrating a circuit optimization method used in analog circuit migration according to an embodiment of the present disclosure.

Firstly, source circuit simulation is performed in step S101. Circuit simulation tools commercially available, such as Spectre from Cadence Inc and Hspice from Synopsys Inc., can be used in the source circuit simulation.

The source circuit simulation includes direct current (DC) analysis, alternating current (AC) analysis, transient analysis and other numerical analysis on the whole source circuit. Details of the above analysis technologies can be read in those published textbooks and documents, and thus not described here.

A result of the source circuit simulation is then analyzed in step S102. The analysis include calculating signal values/profile and functional representation in DC analysis, signal values/profile and functional representation in AC analysis, and signal values/profile and functional representation in transient analysis at different nodes and braches, from the result of the source circuit simulation. An object or a range of the source circuit simulation includes voltages at all nodes, and currents at all branches in the source circuit, and functional representation of the above parameters.

Electrical connections are then analyzed in step S103. The analysis includes direct current path analysis and signal flow (including feedback paths) analysis.

Figure 2:
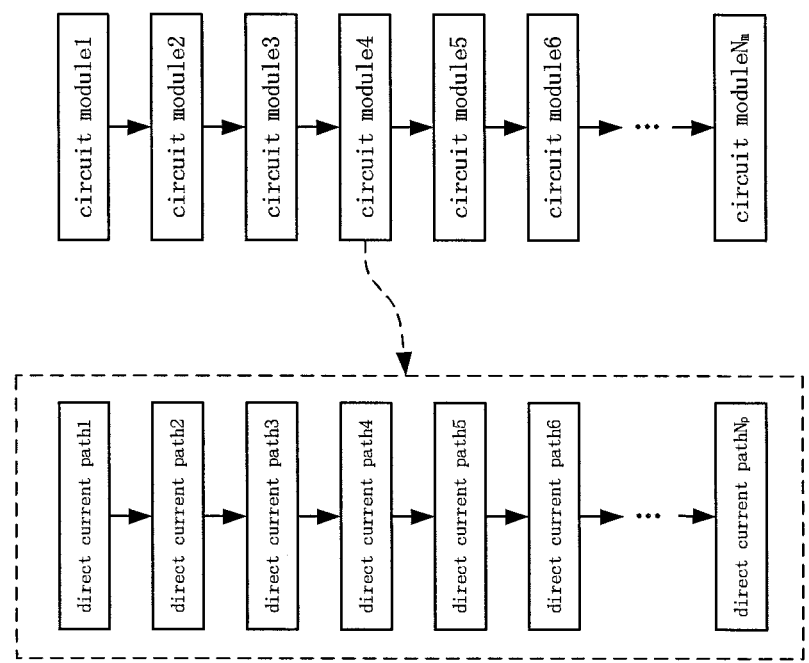
FIG. 2 is a block diagram illustrating how to analyze electrical connections in the circuit optimization method used in the analog circuit migration according to an embodiment of the present disclosure.

When analyzing the electrical connections, the source circuit can be divided into circuit module 1, circuit module 2, circuit module 3, circuit module 4, circuit module 5, circuit module 6, . . . , and circuit module $N_m$, as shown in FIG. 2.

In the direct current path analysis, devices in each circuit module are traversed from any voltage supply terminal to any ground terminal of the circuit module in a direction that current flows in the circuit module. For example, the current flows from a drain to a source in a MOS transistor, from a collector to an emitter in a bipolar transistor, from one terminal to the other terminal in a resistor, and from a P-type region to an N-type region in a diode. Thus, the devices, which are connected between the same voltage supply terminal and the same ground terminal, constitute a direct current path. At least one direct current path can be obtained in each circuit module. For example, the circuit module 4 in FIG. 2 can be subdivided into direct current path 1, direct current path 2, direct current path 3, direct current path 4, direct current path 5, direct current path 6, . . . , and direct current path $N_p$.

In the signal flow analysis, each direct current path known from the direct current path analysis is seen as a unit. In other words, the direct current path is an element of each circuit module. In each circuit module, all of the direct current paths are traversed from an input terminal to an output terminal in a direction of single propagation. An arrival sequence of the signal in the direction of the signal propagation can be denoted by a signal depth. For example, if the current direct current path has the signal depth N, the next direct current path in the direction of the signal propagation has the signal dept N+1.

An adaptation sequence of the circuit is then determined in step S104. The adaptation sequence of the circuit modules and the direct current paths can be determined in accordance with the arrival sequence of the signal.

For example, the adaptation sequence of the circuit modules in FIG. 2 is circuit module 1, circuit module 2, circuit module 3, circuit module 4, circuit module 5, circuit module 6, ..., and circuit module $N_m$. Further, the adaptation sequence of the direct current paths in circuit module 4 is direct current path 1, direct current path 2, direct current path 3, direct current path 4, direct current path 5, direct current path 6, ..., and direct current path $N_p$.

Parameter values of the devices in the target circuit are then set for each direct current path in step S105. It includes setting initial parameter values of the devices in the circuit and setting intermediate parameter values of the devices in the optimization of the parameter values of the devices.

The initial parameter values of the devices in the target circuit can be set by a) randomly setting the initial parameter values of the devices in the target circuit with Pi=rand[$Pi_L$, $Pi_H$], where the initial parameter value Pi of one device in the target circuit can be set as any random value between a lower limit $Pi_L$ and an upper limit $Pi_H$ of the one device; or b) setting the initial parameter values of the devices in the target circuit in accordance with ratios of the devices in the target circuit to the devices in the source circuit and the ratio of a feature size of a new manufacture process to a feature size of a previous manufacture process.

In the above two methods, the method a) can be easily implemented. However, the initial parameter value, if being randomly set, is uncertain. It may deviate largely from the final optimal value and require a large number of iterations in the subsequent optimization. The method b) seems to be more complex than the method a). However, the method b) provides an initial parameter value close to the final optimal value, and requires a less number of iterations. Thus, optimization efficiency of the method b) is higher than that of the method a).

The intermediate parameter values of the devices in the target circuit can be set by a) randomly setting the intermediate parameter values of the devices in the target circuit with Pi=rand[$Pi_L$, $Pi_N$], where the intermediate parameter value Pi of one device in the target circuit can be set as any random value between a lower limit $Pi_L$ and an upper limit $Pi_H$ of the one device, while omitting difference between the circuit property of the target circuit with the current parameter value and the circuit property of the target circuit with the optimal parameter value; or b) varying the intermediate parameter values of the devices in a tendency and an amount that are determined in accordance with difference between an evaluation value of circuit property of one direct current path in the target circuit and a value of circuit property of the corresponding one direct current path in the source circuit, and a tendency and an amount of variation of the circuit property by the parameter values of the devices.

$$Pi_{new}=Pi_{old}+(fspec-fmeas)*k \quad (1)$$

wherein, $Pi_{new}$ is an adjusted value of parameter Pi of the i-th device, which is constant if fspec=fmeas;

$Pi_{old}$ is an unadjusted value of parameter Pi of the i-th device;

fspec is target property of the target circuit;

fmeas is actual property of the target circuit when the value of the parameter Pi of the i-th device has a parameter value $Pi_{old}$; and k is a factor representing an effect of the value of the parameter Pi of the i-th device on the property of the target circuit; when k is equal to 0, the value of Pi is constant.

If the parameter Pi influences a plurality of circuit properties, the intermediate parameter values of the devices in the target circuit can be determined for one major circuit property.

Alternatively, the optimal $Pi_{new}$ can be determined by linear programming of the plurality of circuit properties by $$\min(\Sigma(fspec_j-fcalc_j)^2) \quad (2)$$

wherein, $$fcalc_j=fmeas+k_j*(Pi_{new}-Pi_{old}) \quad (3)$$

wherein, $fspec_j$ is the j-th target property of the target circuit;

$fcalc_j$ is the j-th actual property of the target circuit when the value of the parameter Pi of the i-th device has a parameter value $Pi_{new}$; and $K_j$ is a factor representing an effect of the value of the parameter Pi of the i-th device on the j-th property of the target circuit; when $k_j$ is equal to 0, the value of Pi is constant.

In the above two methods, the method a) can be easily implemented. However, the intermediate parameter value, if being randomly set, is uncertain. The change of the parameter value may occur in a wrong tendency to cause invalid trials. Even in a case that the changed of the parameter value occurs in a correct tendency, the parameter value may be far away from the optimal parameter value, and require a large number of iterations in the subsequent optimization. The method b) seems to be more complex than the method a). However, the method b) provides an intermediate parameter value close to the final optimal value in a correct tendency, and requires a less number of iterations. Thus, the optimization efficiency of the method b) is higher than that of the method a).

Target circuit simulation is then performed in step S106, and a result of the target circuit simulation is analyzed in step S107. The target circuit simulation in step S106 may use a simulation tool similar to that used in the source circuit simulation in step S101, and the result of the target circuit simulation may also be analyzed in a similar manner, details of which are omitted here.

Nevertheless, the target circuit simulation is performed on an object and a range different from those in the source circuit simulation. As mentioned above, a direct current path is used as an element of circuit optimization in the present disclosure. Thus, the object of the target circuit simulation is one direct current path of the target circuit. The direct current paths of the target circuit are optimized one by one in the adaptation sequence determined in step S104. For example, the first object of the target circuit simulation is the first direct current path in the first circuit module, and the second object of the target circuit simulation is the second direct current path of the first circuit module, etc. Moreover, a range of the target circuit simulation includes voltages at all nodes and currents at all branches in the current direct current path and the direct current paths before the current direct current path in the target circuit, and functional representation of the above parameters.

Signals at corresponding nodes of the source circuit and the target circuit are compared in step S108. As mentioned above, a direct current path is used as an element of circuit optimization in the present disclosure. The comparison here includes comparing corresponding voltages at all nodes and corresponding currents at all branches in the current direct current path and the direct current paths before the current direct current path in the source circuit and the target circuit, and comparing corresponding functional representation of the above parameters.

It is then determined whether circuit property of the target circuit meets the design requirement in step S109. The circuit optimization is ended in step S110, if the target circuit meets the design requirement. Otherwise, that is the target circuit does not meet the design requirement, the process turns to step S105. The operations in steps S105-S109 are repeated while setting new parameter values of the devices in the target circuit and/or selecting next one of the direct current paths in the target circuit as a new object of circuit simulation.

Figure 3:
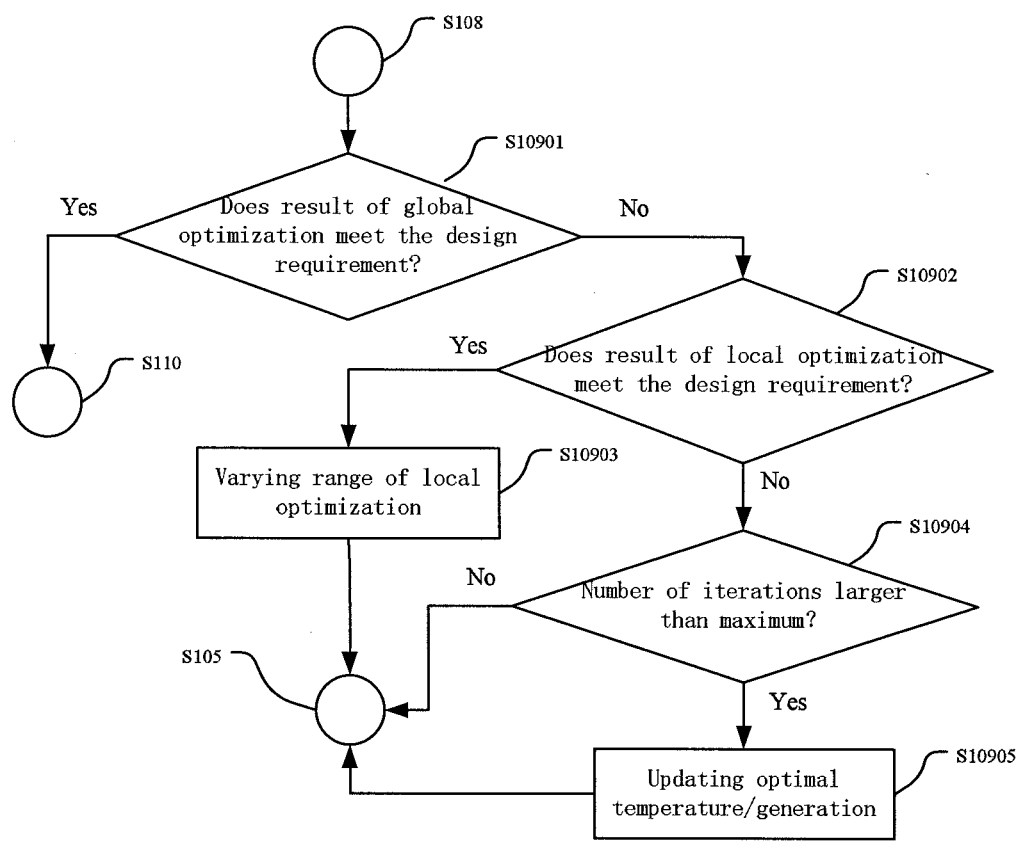
FIG. 3 is a flow chart illustrating an optimization control in the circuit optimization method used in the analog circuit migration according to an embodiment of the present disclosure.

FIG. 3 is a flow chart illustrating an optimization control in the circuit optimization method used in the analog circuit migration according to an embodiment of the present disclosure. In a preferable embodiment of the present disclosure, the optimization criteria are involved in step S109.

In step S10901, it is determined whether a result of global optimization of the target circuit meets the design requirement. If yes, the process turns to step S110 to end the circuit optimization. If no, the process turns to step S10902 to continue subsequent operations.

In step S10902, it is determined whether the current direct current path in the target circuit meets the design requirement. If yes, the process turns to step S10903 to select next one of the direct current paths in the target circuit as a new object of circuit simulation, and further to step S105 to repeat the operations at steps S105-S109, to set initial parameter values of the devices in the next one of the direct current paths in the target circuit. If no, the process turns to step S10904 to continue subsequent operations.

In step S10904, it is determined whether the number of iterations for optimizing the current direct current path in the target circuit is larger than a maximum at a simulated annealing temperature or in a genetic generation. If yes, the process turns to step S10905 to change the simulated annealing temperature and/or the genetic generation, and further to step S105 to repeat the operations at steps S105-S109, to optimize the parameter values of the devices in the current direct current path in the target circuit at new simulated annealing temperature and/or new genetic generation. If no, the process turns to step S105 to repeat the operations at steps S105-S109, to set new parameter values of the devices in the current direct current path in the target circuit.

It should note that the direct current paths in the target circuit are optimized one by one in the adaptation sequence which is determined on the basis of the analysis result of the source circuit. Because the last direct current path in the previous one circuit module is always followed by the first direct current path in the next one circuit module, the circuit modules of the target circuit are also optimized one by one.

The circuit optimization method used in the analog circuit migration according an embodiment of the present disclosure is described above, in which the source circuit and the target circuit are divided into the corresponding circuit modules, which are subdivided into the corresponding direct current paths in each of the circuit modules. Alternatively, the source circuit and the target circuit may be divided directly into some direct current paths, without firstly being divided into circuit modules. For example, the source circuit and the target circuit may be each analyzed as a whole in a case that the integrated circuit has a small size or complex feedback paths, because the optimization efficiency will be increased.

Figure 4:
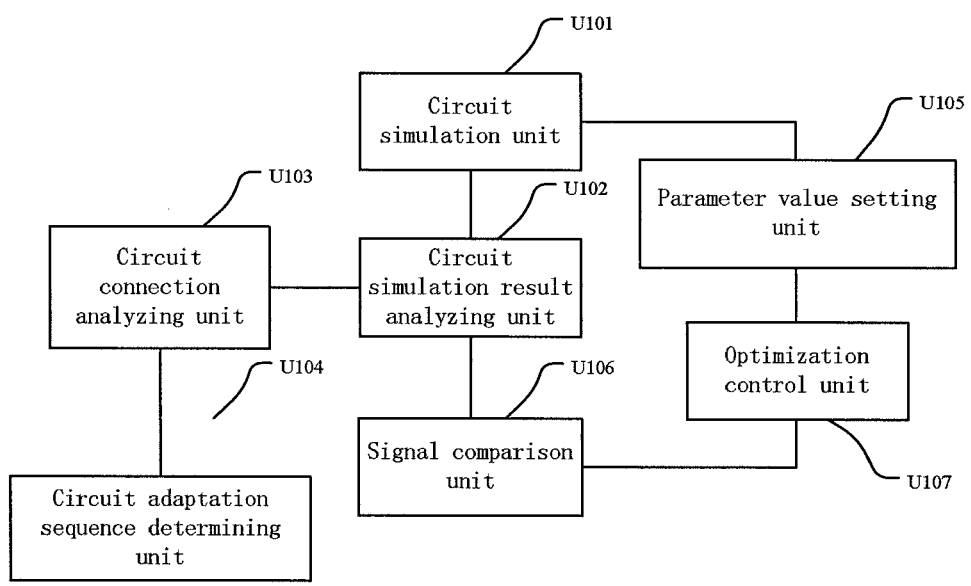
FIG. 4 is a block diagram illustrating a circuit optimization apparatus used in analog circuit migration according to an embodiment of the present disclosure.

FIG. 4 is a block diagram illustrating a circuit optimization apparatus used in analog circuit migration according to an embodiment of the present disclosure. The circuit optimization apparatus comprises a circuit simulation unit U101, a circuit simulation result analyzing unit U102, a circuit connection analyzing unit U103, a circuit adaptation sequence determining unit U104, a parameter value setting unit U105, a signal comparison unit U106, and an optimization control unit U107. Each unit of the circuit optimization apparatus may be in the form of hardware, software, firmware, or any combination thereof.

The circuit simulation unit U101 carries out direct current (DC) analysis, alternating current (AC) analysis, transient analysis and other numerical analysis on each of the source circuit and the target circuit.

The circuit simulation result analyzing unit U102 is coupled to the circuit simulation unit U101. The circuit simulation result analyzing unit U102 calculates signal values/profile and functional representation in DC analysis, signal values/profile and functional representation in AC analysis, and signal values/profile and functional representation in transient analysis at corresponding nodes and braches of the source circuit and the target circuit, from the result of circuit simulation of the source circuit and the target circuit.

In this example, the circuit simulation of the source circuit and the target circuit are both performed in the circuit simulation unit U101, the analysis of the result of the circuit simulation of the source circuit and the target circuit are both performed in the circuit simulation result analyzing unit U102. However, an object and a range of the circuit simulation of the source circuit is different from an object and a range of the circuit simulation of the target circuit. The object or the range of the source circuit simulation includes voltages at all nodes, and currents at all branches in the source circuit, and functional representation of the above parameters. The present disclosure utilizes the direct current paths as elements of the circuit optimization. The object of the circuit simulation of the target circuit is a direct current path. The direct current paths of the target circuit are optimized one by one in the adaptation sequence. For example, the first object of the target circuit simulation is the first direct current path in the first circuit module, and the second object of the target circuit simulation is the second direct current path of the first circuit module, etc. Moreover, a range of the target circuit simulation includes voltages at all nodes and currents at all branches in the current direct current path and the direct current paths before the current direct current path in the target circuit, and functional representation of the above parameters.

The circuit connection analyzing unit U103 is coupled to the circuit simulation result analyzing unit U102. The circuit connection analyzing unit U103 analyzes electrical connects of devices in the source circuit by traversing the devices in the source circuit from any voltage supply terminal to any ground terminal of the source circuit in a direction that current flows in the source circuit.

The circuit adaptation sequence determining unit U104 is coupled to the circuit connection analyzing unit U103. The circuit adaptation sequence determining unit U104 analyzes a signal arrival sequence of the direct current paths in the source circuit by traversing all of the direct current paths from an input terminal to an output terminal in a direction of single propagation. An adaptation sequence of the circuit modules and the direct current paths is determined in accordance with the signal arrival sequence.

The parameter value setting unit U105 is coupled to the circuit simulation unit U101 and an optimization control unit U107. The parameter value setting unit U105 sets initial parameter values of the devices in the target circuit for the circuit simulation unit U101, and sets intermediate parameter values of the devices in the target circuit for the circuit simulation unit U101 in the circuit optimization in accordance with a control signal of the optimization control unit U107.

The signal comparison unit U106 is coupled to the circuit simulation result analyzing unit U102. The signal comparison unit U106 compares corresponding voltages at all nodes and corresponding currents at all branches in the current direct current path and the direct current paths before the current direct current path in the source circuit and the target circuit, and compares corresponding functional representation of the above parameters.

The optimization control unit U107 is coupled to the signal comparison unit U106 and the parameter value setting unit U105. The optimization unit U107 provides a control signal to the parameter value setting unit U105 in accordance with a comparison result of the signal comparison unit U106 to optimize the direct current paths in the target circuit one by one in the adaptation sequence. In the circuit optimization, the parameter value setting unit U105 either sets intermediate parameter values of the devices in the current direct current path in the target circuit for new circuit optimization trials, or sets initial parameter values of the devices in the next one direct current path in the target circuit. The optimization unit U107 varies a simulated annealing temperature and/or a genetic generation for new circuit optimization trials, if a number of invalid trials is larger than a maximum in the simulated annealing temperature and/or the genetic generation. After completing circuit optimization of all of the direct current paths in the target circuit (that is, electrical properties of the target circuit meet the design requirement), the optimization control unit U107 ends the circuit optimization process.

The above circuit optimization method apparatus utilize the direct current paths as elements of the circuit optimization, which decreases computational complexity and the number of invalid trials in the optimization process.

In a conventional process, an object and a range of optimization is the same in a target circuit as in a source circuit, including voltages at all nodes, and currents at all branches in the target circuit, and functional representation of the above parameters.

In an example, the source circuit comprises 50 devices, each with an exploration space of 8. An exploration space of the source circuit as a whole will be $8^{50}$. Thus, the hit probability in each iteration of the optimization process will be $\frac{1}{8}^{50}$. If parameter values of all devices in a target circuit are simultaneously determined, an actual optimization trial time $T_{all}$ of the target circuit can be represented by $$T_{all}=T_1\times 8^{50} \quad (4)$$

wherein $T_1$ is a time period for one optimization trial.

The circuit optimization method according to the present disclosure performs direct current path analysis and signal flow analysis to obtain devices in each of direct current paths, determine an adaptation sequence of the direct current paths in the optimization process, and optimize the direct current paths in the target circuit one by one in the adaptation sequence.

In an example, the source circuit also comprises 50 devices, each with an exploration space of 8. Further, in the example, the source circuit can be divided into 10 direct current paths, each with 5 devices. An exploration space of one direct current path will be $8^5$. Thus, the hit probability in each iteration of the optimization process is $\frac{1}{8}^5$.

An actual optimization trial time $T_{all}$ of the target circuit can be represented by $$T_{all} = \Sigma T_{part,i} \quad (5)$$
$$= 10\times T_1 \times 8^5$$

wherein $T_{part,i}$ is an actual optimization time for the i-th direct current path, and $T_1$ is a time period for one optimization trial.

Comparing the above equation (4) with the above equation (5), it is clear that the circuit optimization method according to the present disclosure is much faster than the conventional circuit optimization method. Such an effect of the circuit optimization is more remarkable as a scale of an integrated circuit increases.

The preferred embodiments of the present disclosure are described in the above paragraphs, but not construed as limiting the present disclosure. Many modifications, equivalence, variations of the preferred embodiments can be made without departing from the doctrine and spirit of the present disclosure.

We claim:

1. A circuit optimization method used in analog circuit migration which migrates a source circuit to a target circuit, comprising:
   dividing the source circuit into at least one direct current path by a computer;
   determining an adaptation sequence of the at least one direct current path; and
   optimizing the at least one direct current path in the target circuit one by one in the adaptation sequence in the source circuit, traversing all devices from voltage supply terminals to ground terminals in a direction of current flow to obtain the at least one direct current path, wherein each of the at least one direct current path comprises all devices that are connected and provide a complete current path between one of the voltage supply terminals and one of the ground terminals; and
   in the source circuit, traversing the at least one direct current path from an input terminal to an output terminal in a direction of signal propagation to obtain a signal arrival sequence of the at least one direct current path; and
   determining the adaptation sequence of the at least one direct current path; and
   setting parameter values of devices in each of the at least one direct current path in the target circuit so that node signals of each of the at least one direct current path in the target circuit meet the design requirement when compared with the corresponding one of the at least direct current path in the source circuit.

2. The circuit optimization method according to claim 1, wherein optimizing the at least one direct current path in the target circuit one by one in the adaptation sequence comprises:
   a) selecting one of the at least one direct current path in the target circuit in the adaptation sequence;
   b) setting parameter values of the devices in the one of the at least one direct current path in the target circuit;
   c) performing target circuit simulation on the one of the at least one direct current path in the target circuit, and on all of the direct current paths which precede the one of the at least one direct current path in the target circuit;

d) analyzing a result of the target circuit simulation to provide node signals of the one of the at least one current path in the target circuit;

e) comparing the node signals of the one of the at least one direct current path in the target circuit with the node signals of the corresponding one of the at least one direct current path in the source circuit; and f) repeating steps a) to e) under optimization control criteria so that all of the at least one direct current path in the target circuit meet the design requirement.

3. The circuit optimization method according to claim 2, wherein repeating the steps a) to e) under the optimization control criteria comprises:

repeating steps a) to e) while setting new parameter values of the devices to optimize the one of the at least one direct current path in the target circuit, if the one of the at least one direct current path in the target circuit does not meet the design requirement;

repeating steps a) to e) while selecting and optimizing next one of the at least one direct current path in the target circuit, if the one of the at least one direct current path in the target circuit meets the design requirement; and ending the circuit optimization if all of the at least one direct current path in the target circuit meet the design requirement.

4. The circuit optimization method according to claim 3, wherein repeating steps a) to e) under the optimization control criteria comprises:

repeating steps a) to e) while varying a simulated annealing temperature and/or a genetic generation for new circuit optimization trials, if the number of invalid trials is larger than a maximum in the simulated annealing temperature and/or the genetic generation.

5. The circuit optimization method according to claim 2, wherein setting the parameter values of the devices in the one of the at least one direct current path in the target circuit comprises:

setting initial parameter values of the devices in the one of the at least one direct current path in the target circuit when optimization of the parameter values of the devices starts; and setting intermediate parameter values of the devices in the one of the at least one direct current path in the target circuit in the optimization of the parameter values of the devices.

6. The circuit optimization method according to claim 5, wherein setting the initial parameter values of the devices in the one of the at least one direct current path in the target circuit comprises:

randomly setting the initial parameter values of the devices in the target circuit; or setting the initial parameter values of the devices in the target circuit in accordance with ratios of the devices in the target circuit to the devices in the source circuit and the ratio of a feature size of a new manufacture process to a feature size of a previous manufacture process.

7. The circuit optimization method according to claim 5, wherein setting the intermediate parameter values of the devices in the one of the at least one direct current path in the target circuit comprises:

randomly setting the intermediate parameter values of the devices in the target circuit; or varying the intermediate parameter values of the devices in a tendency and an amount that are determined in accordance with difference between an evaluation value of circuit property of the one of the at least one direct current path in the target circuit and a value of circuit property of the corresponding one of the at least one direct current path in the source circuit, and a tendency and an amount of variation of the circuit property by the parameter values of the devices.

8. The circuit optimization method according to claim 7, wherein setting the intermediate parameter values of the devices in the one of the at least one direct current path in the target circuit comprises:

determining optimal parameter values of the devices by linear programming of a plurality of circuit properties.

9. The circuit optimization method according to claim 1, wherein dividing the source circuit into the at least one direct current path comprises:

dividing the source circuit into at least one circuit module; and subdividing each of the at least one circuit module into at least one direct current path.

10. A circuit optimization apparatus used in analog circuit migration which migrates a source circuit to a target circuit, comprising:

a circuit simulation unit configured to perform source circuit simulation and target circuit simulation;

a circuit simulation result analyzing unit coupled to the circuit simulation unit and configured to calculate node signals of the source circuit and the target circuit in accordance with results of the source circuit simulation and the target circuit simulation;

a circuit connection analyzing unit coupled to the circuit simulation result analyzing unit and configured to analyzing circuit connections of the source circuit to determine direct current paths in the source circuit;

a circuit adaptation sequence determining unit coupled to the circuit connection analyzing unit and configured to analyze a signal arrival sequence of the direct current paths in the source circuit and obtain an adaptation sequence of the direct current paths in the source circuit in accordance with the signal arrival sequence;

a parameter value setting unit coupled to the circuit simulation unit and an optimization control unit, and configured to setting parameter values of the devices in one of the direct current path in the target circuit;

a signal comparison unit coupled to the circuit simulation result analyzing unit, and configured to compare node signals of the one of the direct current paths in the target circuit and the corresponding one of the direct current paths in the source circuit; and the optimization control unit coupled to the signal comparison unit and the parameter value setting unit, and configured to provide a control signal to the parameter value setting unit in accordance with a comparison result of the signal comparison unit to optimize the direct current paths in the target circuit one by one in the adaptation sequence.

11. The circuit optimization apparatus according to claim 10, wherein the optimization control unit is configured to:

set new parameter values of the devices to optimize one of the direct current paths in the target circuit, if the one of the direct current paths in the target circuit does not meet the design requirement;

select and optimize next one of the direct current paths in the target circuit, if the one of the direct current paths in the target circuit meets the design requirement; and end the circuit optimization if all of the direct current paths in the target circuit meet the design requirement.

12. The circuit optimization apparatus according to claim 11, wherein the optimization control unit is configured to:

vary a simulated annealing temperature and/or a genetic generation for new circuit optimization trials, if the number of invalid trials is larger than a maximum in the simulated annealing temperature and/or generation.

\* \* \* \* \*

UNITED STATES PATENT AND TRADEMARK OFFICE
CERTIFICATE OF CORRECTION

Page 1 of 1

PATENT NO. : 8,516,429 B2
APPLICATION NO. : 13/640594
DATED : August 20, 2013
INVENTOR(S) : Yuping Wu et al.

It is certified that error appears in the above-identified patent and that said Letters Patent is hereby corrected as shown below:

Title page:

At (73) Assignee, delete "Midtronics, Inc., Willowbrook, IL (US)" and insert -- Institute of Microelectronics, Chinese Academy of Sciences --

Signed and Sealed this
Eighth Day of April, 2014

Michelle K. Lee
*Deputy Director of the United States Patent and Trademark Office*